(12) United States Patent
Ueda et al.

(10) Patent No.: US 11,120,858 B2
(45) Date of Patent: Sep. 14, 2021

(54) MAGNETIC MEMORY

(71) Applicant: Kioxia Corporation, Tokyo (JP)

(72) Inventors: Yoshihiro Ueda, Yokohama Kanagawa (JP); Michael Arnaud Quinsat, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/914,511

(22) Filed: Jun. 29, 2020

(65) Prior Publication Data

US 2021/0082484 A1    Mar. 18, 2021

(30) Foreign Application Priority Data

Sep. 17, 2019  (JP) .............................. JP2019-168715

(51) Int. Cl.
*G11C 11/16* (2006.01)
*H01L 43/02* (2006.01)
*H01L 27/22* (2006.01)

(52) U.S. Cl.
CPC .......... *G11C 11/165* (2013.01); *H01L 27/222* (2013.01); *H01L 43/02* (2013.01); *G11C 11/16* (2013.01)

(58) Field of Classification Search
None
See application file for complete search history.

(56) References Cited

U.S. PATENT DOCUMENTS

| 9,293,696 | B2 | 3/2016 | Ootera et al. |
| 9,705,073 | B2 | 7/2017 | Morise et al. |
| 9,886,199 | B2 | 2/2018 | Kondo et al. |
| 10,032,499 | B2 | 7/2018 | Kado et al. |
| 10,304,902 | B2 | 5/2019 | Kado et al. |
| 2003/0214836 | A1* | 11/2003 | Oh .......................... G11C 11/16 365/158 |
| 2008/0278994 | A1* | 11/2008 | Katti ................... G11C 11/1675 365/158 |

(Continued)

FOREIGN PATENT DOCUMENTS

| JP | 2016-9806 A | 1/2016 |
| JP | 2017-54936 A | 3/2017 |

(Continued)

OTHER PUBLICATIONS

Honjo et al. "Domain-wall-motion cell with perpendicular anisotropy wire and in-plane magnetic tunneling junctions," J. Appl. Phys., 111:07C903-1-07C903-3 (Feb. 14, 2012).

(Continued)

*Primary Examiner* — Tan T. Nguyen
(74) *Attorney, Agent, or Firm* — Finnegan, Henderson, Farabow, Garrett & Dunner L.L.P.

(57) ABSTRACT

A magnetic memory according to an embodiment includes: a first wiring; a second wiring; a first switching element disposed between the first wiring and the second wiring; a first magnetic member extending in a first direction and disposed between the first switching element and the second wiring; a third wiring disposed between the first magnetic member and the second wiring; a first magnetoresistive element disposed between the third wiring and the second wiring; and a second switching element disposed between the first magnetoresistive element and the second wiring.

21 Claims, 14 Drawing Sheets

(56) References Cited

U.S. PATENT DOCUMENTS

| | | |
|---|---|---|
| 2019/0287593 A1 | 9/2019 | Ueda |
| 2020/0082863 A1 | 3/2020 | Ueda et al. |
| 2020/0082864 A1 | 3/2020 | Ueda |
| 2020/0082865 A1 | 3/2020 | Ueda |
| 2020/0090775 A1 | 3/2020 | Ueda |
| 2020/0185601 A1* | 6/2020 | Bozdag ................ G11C 11/005 |
| 2020/0243124 A1* | 7/2020 | Bozdag ................ G11C 11/161 |
| 2020/0303027 A1 | 9/2020 | Ueda et al. |

FOREIGN PATENT DOCUMENTS

| | | |
|---|---|---|
| JP | 2017-143175 A | 8/2017 |
| JP | 6397773 B2 | 9/2018 |
| JP | 2019-54191 A | 4/2019 |
| JP | 2019-164848 A | 9/2019 |
| JP | 2020-42879 A | 3/2020 |
| JP | 2020-42880 A | 3/2020 |
| JP | 2020-42882 A | 3/2020 |
| JP | 2020-47728 A | 3/2020 |
| JP | 2020-155178 A | 9/2020 |

OTHER PUBLICATIONS

Honjo et al., "Three-terminal magnetic tunneling junction device with perpendicular anisotropy CoFeB sensing layer," J. Appl. Phys., 115:17B750-1-176750-3 (Mar. 25, 2014).

\* cited by examiner

US 11,120,858 B2

MAGNETIC MEMORY

CROSS REFERENCE TO RELATED APPLICATIONS

This application is based upon and claims the benefit of priority from the prior Japanese Patent Application No. 2019-168715, filed on Sep. 17, 2019, the entire contents of which are incorporated herein by reference.

FIELD

Embodiments described herein relate generally to magnetic memories.

BACKGROUND

A magnetic memory is known, in which domain walls of a magnetic member are moved (shifted) due to a current caused to flow through the magnetic member. In such a magnetic memory, a first wiring is electrically connected to one end of the magnetic member, and a second wiring is electrically connected to the other end via a magnetoresistive element (for example, magnetic tunnel junction (MTJ) element) and a switching element, and the domain walls of a magnetic member are moved when a shift current for shifting the domain walls is caused to flow between the first wiring and the second wiring. The magnetic memory including such a configuration has a problem in that it is difficult to keep a sufficient operational margin.

DETAILED DESCRIPTION

A magnetic memory according to an embodiment includes: a first wiring; a second wiring; a first switching element disposed between the first wiring and the second wiring; a first magnetic member extending in a first direction and disposed between the first switching element and the second wiring; a third wiring disposed between the first magnetic member and the second wiring; a first magnetoresistive element disposed between the third wiring and the second wiring; and a second switching element disposed between the first magnetoresistive element and the second wiring.

First Embodiment

Figure 1:
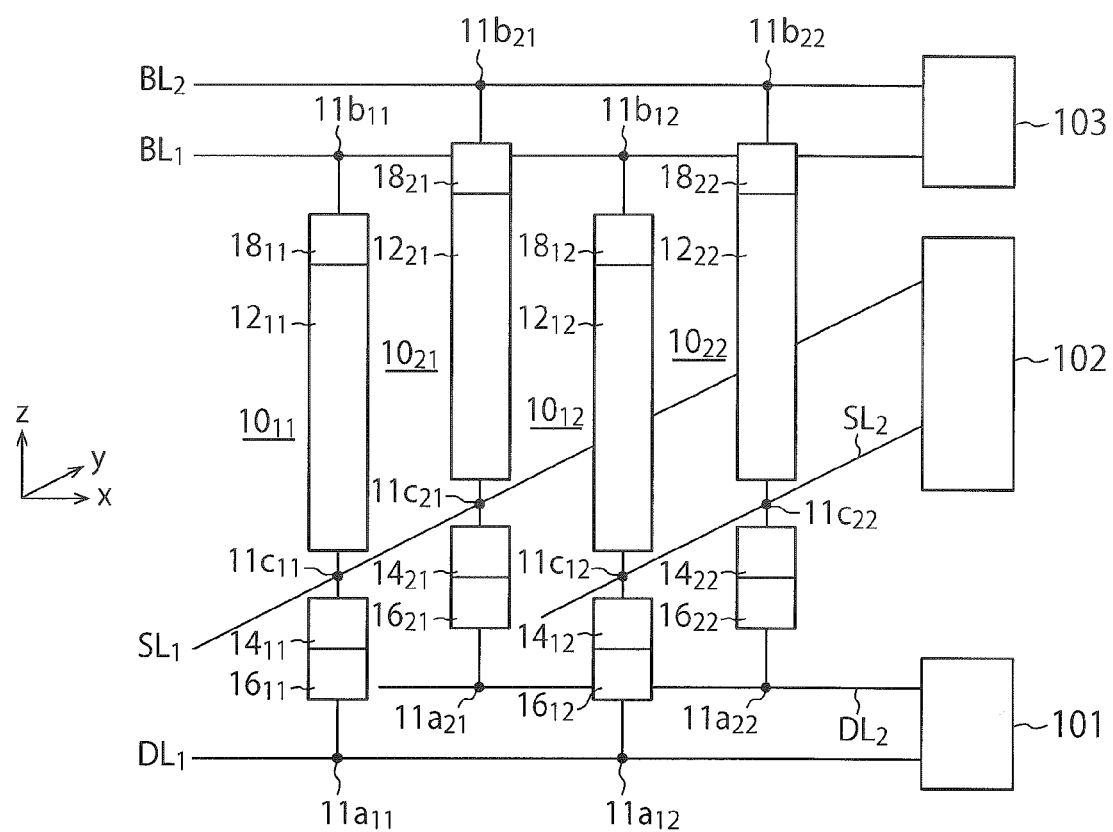
FIG. 1 is a schematic diagram of a magnetic memory according to a first embodiment.

FIG. 1 shows a magnetic memory according to a first embodiment. The magnetic memory according to the first embodiment includes a plurality of (four in FIG. 1) memory cells $10_{11}$, $10_{12}$, $10_{21}$, and $10_{22}$ arranged in an array form, bit lines (first wirings) $BL_1$ and $BL_2$, data lines (second wirings) $DL_1$ and $DL_2$, source lines (third wirings) $SL_1$ and $SL_2$, and control circuits 101, 102, and 103. The memory cell $10_{ij}$ (i, j=1, 2) includes first to third terminals, in which a first terminal $11a_{ij}$ is electrically connected to the data line $DL_i$, a second terminal $11b_{ij}$ is electrically connected to the bit line $BL_i$, and a third terminal $11c_{ij}$ is electrically connected to the source line $SL_j$. The data lines $DL_1$ and $DL_2$ are electrically connected to the control circuit 101, the source lines $SL_1$ and $SL_2$ are electrically connected to the control circuit 102, and the bit lines $BL_1$ and $BL_2$ are electrically connected to the control circuit 103. Although three control circuits controls the data lines, the source lines, and the bit lines in FIG. 1, a single control circuit may control all lines.

The description "A and B are electrically connected" herein means that A and B may be directly connected or indirectly connected via a conducting member. Although the magnetic memory shown in FIG. 1 includes four memory cells, an m×n array of memory cells where each of m and n is a natural number may be provided. In such a case, the magnetic memory includes m data lines $DL_1$ to $DL_m$, m bit lines $BL_1$ to $BL_m$, and n source lines $SL_1$ to $SL_n$.

Each memory cell $10_{ij}$ (i, j=1, 2) includes a magnetic member $12_{ij}$, a magnetoresistive element $14_{ij}$, a switching element $16_{ij}$, including two terminals, and a switching element $18_{ij}$, including two terminals.

The magnetic member $12_{ij}$ (i, j=1, 2) is formed of a vertically magnetized material and extends in a z direction (the vertical direction in FIG. 1). One end of the magnetic member $12_{ij}$ (i, j=1, 2) is electrically connected to the source line $SL_j$, via the third terminal $11c_{ij}$, and the other end is electrically connected to the bit line $BL_i$ via one of the terminals of the switching element $18_{ij}$. The one end of the magnetic member $12_{ij}$ (i, j=1, 2) is preferably in contact with the source line $SL_j$; at the third terminal $11c_{ij}$. The data lines $DL_1$ and $DL_2$ and the bit lines $BL_1$ and $BL_2$ extend in an x direction (the horizontal direction in FIG. 1), and the source lines $SL_1$ and $SL_2$ extend in a y direction that is perpendicular to the z direction and the x direction.

The magnetoresistive element $14_{ij}$ (i, j=1, 2) reads information (magnetization direction) written to the magnetic member $12_{ij}$. For example, a magnetic tunnel junction (MTJ) element is used as the magnetoresistive element $14_{ij}$. In the following descriptions, the magnetoresistive element $14_{ij}$ (i, j=1, 2) is an MTJ element. In the MTJ element $14_{ij}$ (i, j=1, 2), a first terminal is electrically connected to the source line $SL_j$, and a second terminal is electrically connected to one of the terminals of the switching element $16_{ij}$.

The other terminal of the switching element $16_{ij}$ (i, j=1, 2) is electrically connected to the data line $DL_i$ via the first terminal $11a_{ij}$, and the other terminal of the switching element $18_{ij}$ (i, j=1, 2) is electrically connected to the bit line $BL_i$ via the second terminal $11b_{ij}$.

Figure 2:
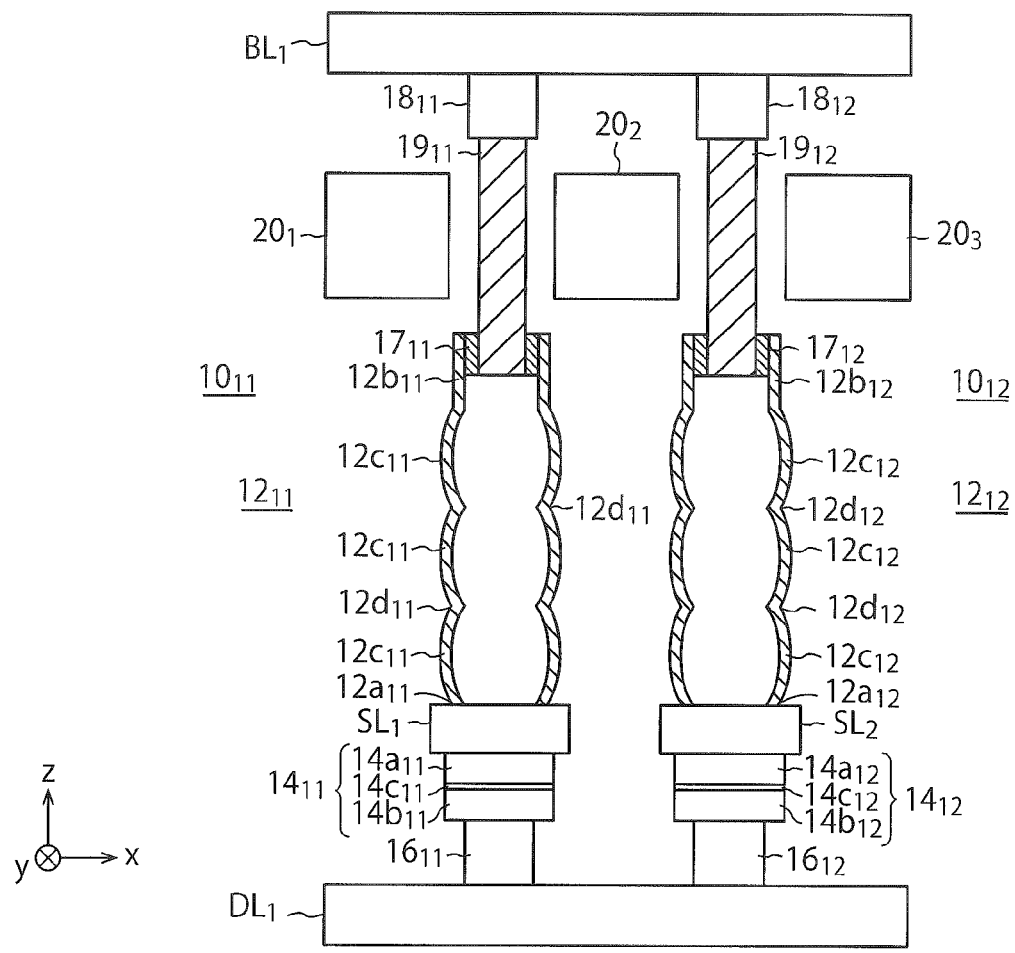
FIG. 2 is a schematic diagram of a specific example of the magnetic memory according to the first embodiment.

The configuration of the memory cell $10_{ij}$ (i, j=1, 2) will then be described in detail with reference to FIG. 2. FIG. 2 is a cross-sectional view of the magnetic memory taken along the data line $DL_1$.

The magnetic member $12_{ij}$ (i, j=1, 2) is, for example, in a cylindrical shape extending in the z direction, and has a first end portion $12a_{ij}$ and a second end portion $12b_{ij}$. The cross section of the magnetic member $12_{ij}$ (i, j=1, 2) taken along the x-y plane has, for example but not limited to, a ring shape. The peripheral shape of the cross section may be in a circular, an oval, or a polygonal shape.

The magnetic member $12_{ij}$ (i, j=1, 2) is formed of a multi-layer film including layers of cobalt or nickel for example. In addition to cobalt or nickel, an alloy containing an element selected from iron, cobalt, platinum, palladium, magnesium, and a rare earth element may also be used to form the magnetic member $12_{ij}$, (i, j=1, 2).

The magnetic member $12_{ij}$ (i, j=1, 2) includes a plurality of regions $12c_{ij}$, arranged along the z direction. The regions $12c_{ij}$ may be separated from one another by narrow portions $12d_{ij}$ disposed on an outer surface of the magnetic member $12_{ij}$. Each region $12c_{ij}$ (i, j=1, 2) has at least one magnetic domain. When a drive current (shift current) is supplied between the first end portion $12a_{ij}$ and the second end portion $12b_{ij}$ of the magnetic member $12_{ij}$ (i, j=1, 2), the domain walls of the magnetic member $12_{ij}$ move in the z direction. When no drive current is supplied, the domain walls stay at the narrow portions $12d_{ij}$. The first end portion $12a_{ij}$ of the magnetic member $12_{ij}$ (i, j=1, 2) is electrically connected to the source line $SL_{ij}$, and preferably in contact with the source line $SL_{ij}$.

The MTJ element $14_{ij}$ (i, j=1, 2) includes a free layer $14a_{ij}$ in which the magnetization direction is changeable, a fixed layer $14b_{ij}$ in which the magnetization direction is fixed, and a non-magnetic insulating layer (tunnel barrier layer) $14c_{ij}$ disposed between the free layer $14a_{ij}$ and the fixed layer $14b_{ij}$. In the MTJ element $14_{ij}$ (i, j=1, 2), the free layer $14a_{ij}$ is electrically connected to the first end portion $12a_{ij}$ of the magnetic member $12_{ij}$, and the fixed layer $14b_{ij}$ is electrically connected to the one of the terminals of the switching element $16_{ij}$. The free layer $14a_{ij}$ of the MTJ element $14_{ij}$ (i, j=1, 2) is preferably in contact with the source line $SL_j$. In other words, the free layer $14a_{ij}$ of the MTJ element $14_{ij}$ (i, j=1, 2) is preferably in contact with a surface of the source line $SL_j$ (the lower surface in FIG. 2). The other terminal of the switching element $16_{ij}$ (i, j=1, 2) is electrically connected to the data line $DL_i$. A magnetoresistive element obtained by replacing the non-magnetic insulating layer of the MTJ element with a non-magnetic metal layer may be used instead of the MTJ element.

The second end portion $12b_{ij}$ of the magnetic member $12_{ij}$ (i, j=1, 2) is electrically connected to one end of a magnetic member $19_{ij}$ via a non-magnetic conducting member $17_{ij}$ disposed to be in contact with the inner surface of the second end portion $12b_{ij}$. The one end of the magnetic member $19_{ij}$ (i, j=1, 2) is disposed to be inserted into the second end portion $12b_{ij}$ of the magnetic member $12_{ij}$. The other end of the magnetic member $19_{ij}$ is electrically connected to the one of the terminals of the switching element $18_{ij}$. The magnetic member $19_{ij}$ (i, j=1, 2) is formed of, for example, a soft magnetic material.

The other of the terminals of the switching element $18_{ij}$ (i, j=1, 2) is electrically connected to the bit line $BL_i$. A field line ("FL") $20_1$ is disposed on a side in the x direction (on the left side in FIG. 2) of the magnetic member $19_{11}$, and a field line $20_2$ is disposed on the other side (on the right side). The field line $20_2$ is also on a side in the x direction (on the left side in FIG. 2) of the magnetic member $19_{12}$, and a field line $20_3$ is disposed on the other side (on the right side). The field line $20_2$ is therefore disposed between the magnetic member $19_{11}$ and the magnetic member $19_{12}$. The field lines $20_1$, $20_2$, and $20_3$ extend in the y direction.

As will be described later in the descriptions of the write method, data (magnetization direction) is written to each of the magnetic members $19_{11}$-$19_{22}$ by a magnetic field generated by a write current flowing through the field line, and the written data is moved to the first end portion $12a_{ij}$ of the magnetic member $12_{ij}$ when a drive current (shift current) is supplied between the first end portion $12a_{ij}$ and the second end portion $12b_{ij}$ of the corresponding magnetic member $12_{ij}$ (i=1, j=1, 2). The data is then read by detecting a strayed magnetic field from the first end portion $12a_{ij}$ (i=1, j=1, 2) at the free layer $14a_{ij}$ of the MTJ element $14_{ij}$.

The switching element $16_{ij}$ (i, j=1, 2) and the switching element $18_{ij}$ (i, j=1, 2) may be, for example, two-terminal switching elements. When the value of a voltage applied across the two terminals is equal to or less than a threshold value, the switching elements $16_{ij}$ and $18_{ij}$ (i, j=1, 2) are in a "high-resistance" state, which is an electrically nonconductive state, for example. When the value of the voltage applied across the two terminals is more than the threshold value, the switching elements $16_{ij}$ and $18_{ij}$ (i, j=1, 2) are in a "low-resistance" state, which is an electrically conductive state, for example. When in the ON state, the switching elements $16_{ij}$ and $18_{ij}$ (i, j=1, 2) keep the ON state as long as a current having a value equal to or more than a holding current value flows. The switching elements $16_{ij}$ and $18_{ij}$ (i, j=1, 2) may have this function regardless of the polarity of the voltage. The switching elements $16_{ij}$ and $18_{ij}$ (i, j=1, 2) are formed of at least one chalcogen element selected from a group of Te, Se, and S. A chalcogenide, which is a compound of one or more of the above elements, may also be used. The switching elements may also be formed of at least one of the elements selected from a group of B, Al, Ga, In, C, Si, Ge, Sn, As, P, and Sb.

(Operations)

Operations of the magnetic memory according to the first embodiment will now be described with reference to FIGS. 2 to 6.

(Write Operation)

First, a write operation will be described below. An example in which data is written to the memory cell $10_{11}$ will be described. Currents are caused to flow in the opposite directions through the field lines $20_1$ and $20_2$ to generate a magnetic field for controlling the magnetization of the magnetic member $19_{11}$. The magnetization of the magnetic member $19_{11}$ controls, via the conducting member $17_{11}$, the magnetization in the region $12c_{11}$ that is the closest to the end portion $12b_{11}$ of the magnetic member $12_{11}$ to write data (magnetization direction). The control operation for causing the currents to flow through the field lines $20_1$ to $20_3$ may be performed by any of the control circuits 101, 102, and 103 shown in FIG. 1, or any other control circuit that is not shown.

The switching element $18_{11}$ is then brought into the ON state by the control circuits 102 and 103, and a shift current is caused to flow between the bit line $BL_1$ and the source line $SL_1$ to move the data written to the region $12c_{11}$ toward the end portion $12a_{11}$ side of the magnetic member $12_{11}$.

Figure 3:
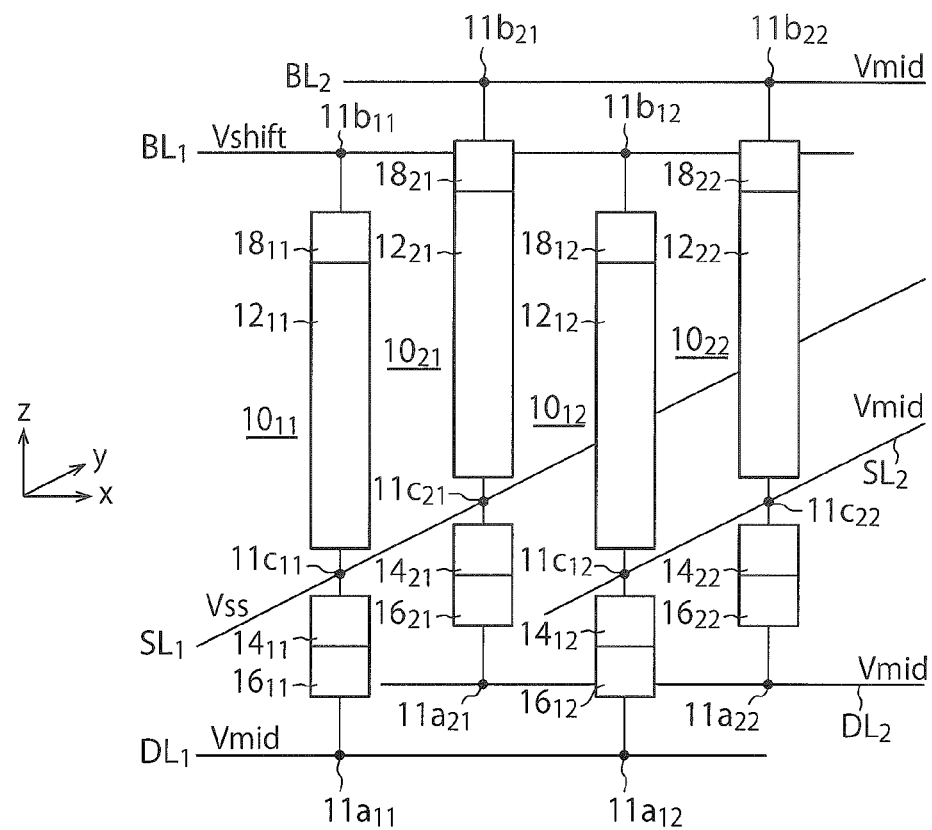
FIG. 3 is a schematic diagram showing voltage conditions during a shift operation of the magnetic memory according to the first embodiment.
Figure 4:
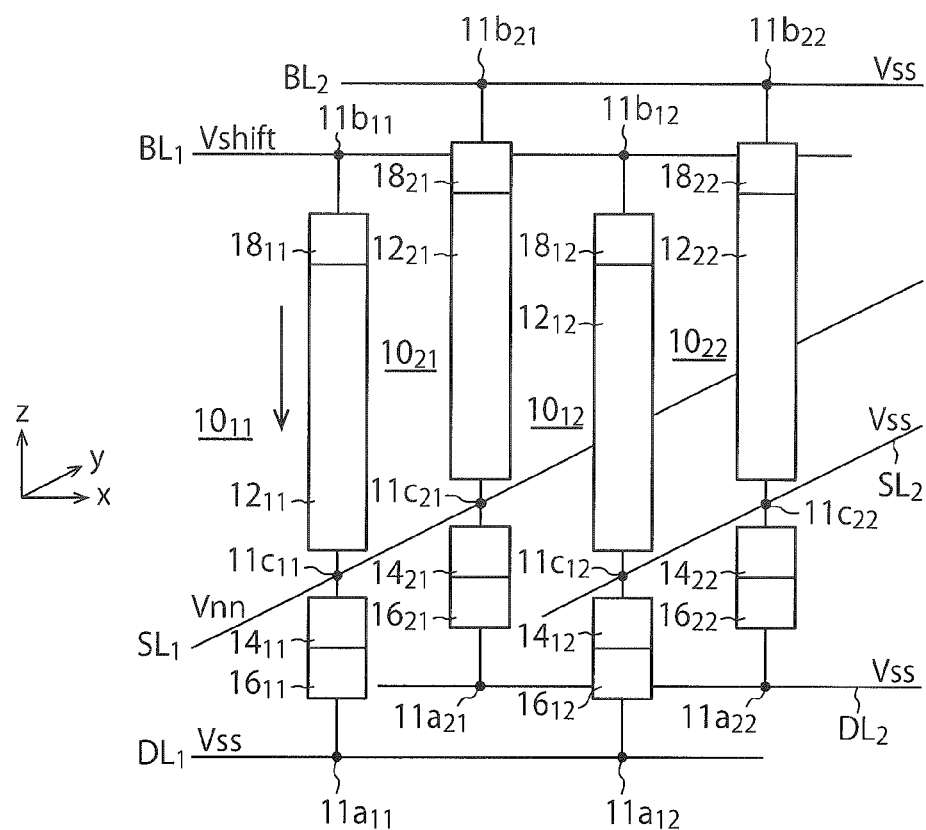
FIG. 4 is a schematic diagram showing voltage conditions during a shift operation of the magnetic memory according to the first embodiment.

FIG. 3 shows the voltage conditions in a case where a ground voltage Vss is applied to the source line $SL_1$ during the shift operation, and FIG. 4 shows the voltage conditions in a case where a negative voltage Vnn is applied to the source line $SL_1$. In the cases shown in FIGS. 3 and 4, the domain walls move in a direction along which the current flows. In the case shown in FIG. 3, the control circuit 103 applies a shift voltage Vshift to the bit line $BL_1$, and the control circuit 102 applies the ground voltage Vss to the source line $SL_1$. At this time, an intermediate voltage Vmid between the shift voltage Vshift and the ground voltage Vss is applied to the wirings that are not connected to the memory cell $10_{11}$, for example the bit line $BL_2$, the source line $SL_2$, and the data lines $DL_1$ and $DL_2$. In the case shown in FIG. 4, the control circuit 103 applies the shift voltage Vshift to the bit line $BL_1$, and the control circuit 102 applies the negative voltage Vnn to the source line $SL_1$. The control circuits 101, 102, and 103 apply the ground voltage Vss to the wirings that are not connected to the memory cell $10_{11}$, for example, the bit line $BL_2$, the source line $SL_2$, and the data lines $DL_1$ and $DL_2$. In both cases, the shift current flows from the bit line $BL_1$ to the source line $SL_1$ via the switching element $18_{11}$, the magnetic member $19_{11}$, the conducting member $17_{11}$, and the magnetic member $12_{11}$, but does not flow through the magnetic member $12_{12}$, the magnetic member $12_{21}$, the magnetic member $12_{22}$, and the switching elements $18_{12}$, $18_{21}$, and $18_{22}$. The shift current does not flow through the MTJ elements $14_{11}$, $14_{12}$, $14_{21}$, and $14_{22}$, and the switching elements $16_{11}$, $16_{12}$, $16_{21}$, and $16_{22}$, either.

(Read Operation)

Figure 5:
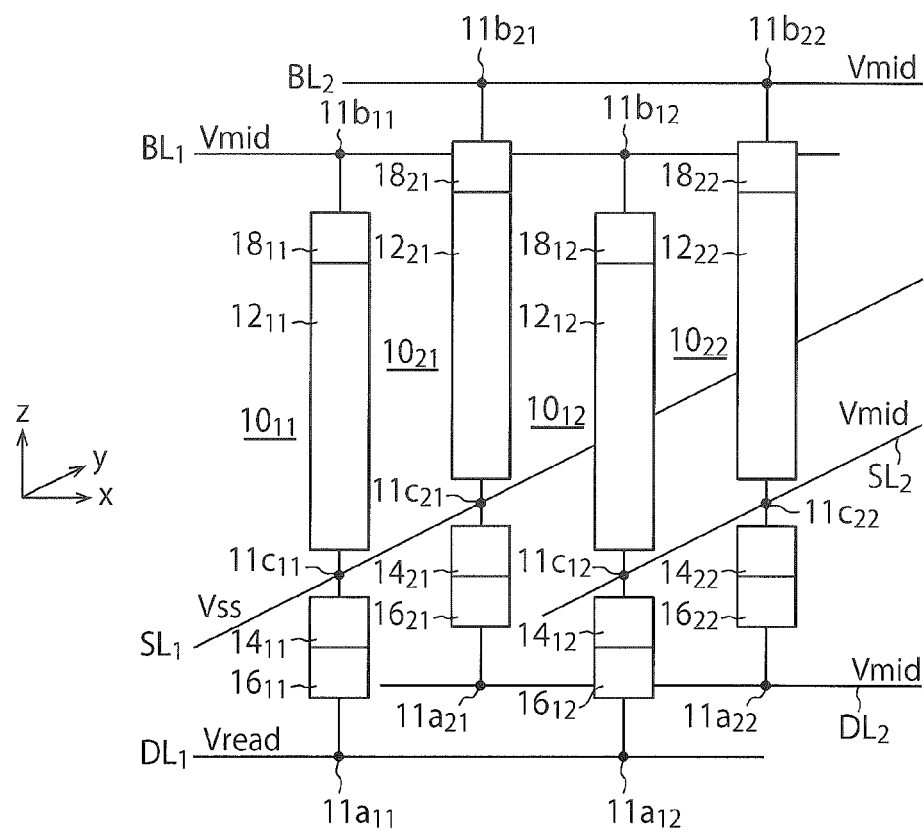
FIG. 5 is a schematic diagram showing voltage conditions during a read operation of the magnetic memory according to the first embodiment.
Figure 6:
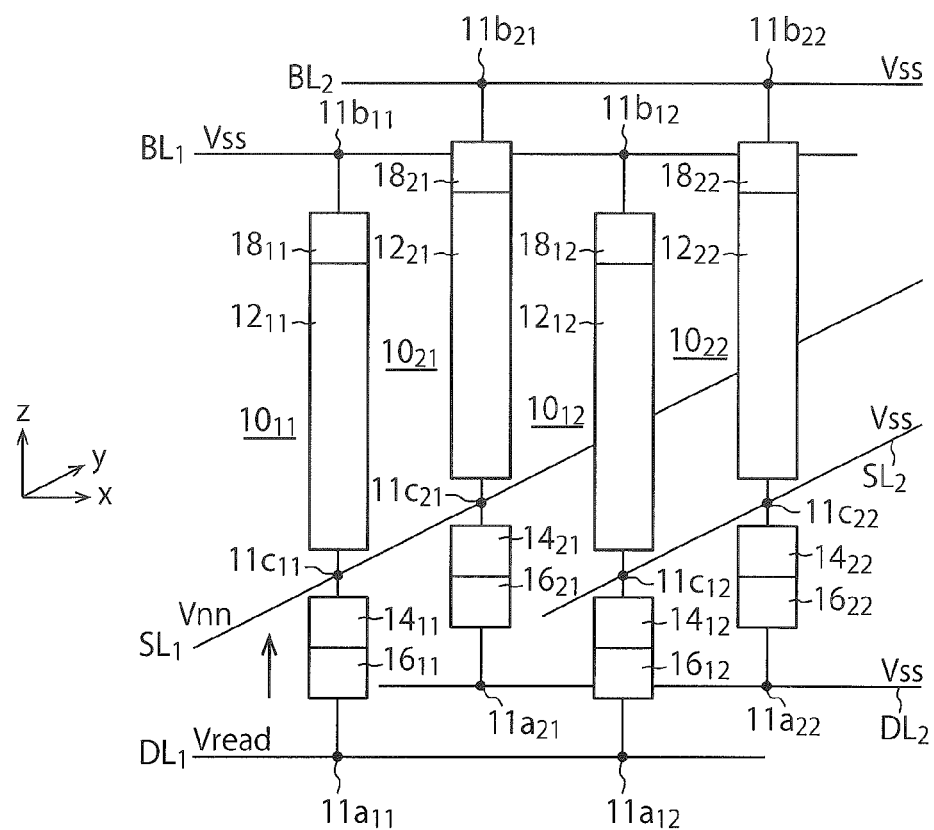
FIG. 6 is a schematic diagram showing voltage conditions during a read operation of the magnetic memory according to the first embodiment.

A read operation will be described below with respect to a case where data is read from the memory cell $10_{11}$. First, the control circuit 101 and the control circuit 102 turn on the switching element $16_{11}$. FIG. 5 shows the voltage conditions in a case where the control circuit 101 applies a ground voltage Vss to the source line $SL_1$, and FIG. 6 shows the voltage conditions in a case where the control circuit 101 applies a negative voltage Vnn to the source line $SL_1$. In the case shown in FIG. 5, the control circuit 101 applies a read voltage Vread to the data line $DL_1$, and the control circuit 102 applies the ground voltage Vss to the source line $SL_1$. At this time, the control circuits 101, 102, and 103 apply an intermediate voltage Vmid between the read voltage Vread and the ground voltage Vss to the wirings that are not connected to the MTJ element $14_{11}$, for example the bit lines $BL_1$ and $BL_2$, the source line $SL_2$, and the data line $DL_2$. In the case shown in FIG. 6, the control circuit 101 applies the read voltage Vread to the data line $DL_1$, and the control circuit 102 applies the negative voltage Vnn to the source line $SL_1$. The control circuits 101, 102, and 103 apply the ground voltage Vss to the wirings that are not connected to the memory cell $10_{11}$, for example the bit lines $BL_1$ and $BL_2$, the source line $SL_2$, and the data line $DL_2$. In both cases, the read current flows from the data line $DL_1$ to the source line $SL_1$ via the switching element $16_{11}$ and the MTJ element $14_{11}$, but does not flow through the MTJ elements $14_{12}$, $14_{21}$, and $14_{22}$ and the switching elements $16_{12}$, $16_{21}$, and $16_{22}$. The read current does not flow through the magnetic members $12_{11}$, $12_{12}$, $12_{21}$, and $12_{22}$ and the switching elements $18_{11}$, $18_{12}$, $18_{21}$, and $18_{22}$, either. The free layer of the MTJ element $14_{11}$ has a magnetization direction that responds to the strayed magnetic field from the region $12c_{11}$ of the magnetic member $12_{11}$, which is the closest to the MTJ element $14_{11}$. Therefore, the read data corresponds to the data stored in the region $12c_{11}$.

Although the domain walls move in the direction along which the current flows in this embodiment, the domain walls may move in a direction that is opposite to the direction along which the current flows. The moving direction of the domain walls may be controlled by such factors as the material of the magnetic member, the material and the location of the conducting member stacked on the magnetic member, and the manufacturing conditions. The material of the conducting member stacked on the magnetic member may be Pt, W, or Ta, for example, but not limited to those materials. The movement of the domain walls may be controlled by using the spin orbit torque (SOT) effect that is dependent on the material of the conducting member.

As described above, in the magnetic memory according to this embodiment, the current path of the shift current for moving the domain wall is separated from the current path of the read current. Therefore, erroneous shifting caused by the read current, read disturb, may be prevented. As a result, the operational margin determined by the current variation distribution may be broadened. The broadening of the operational margin will be described below with reference to a comparative example.

COMPARATIVE EXAMPLE

Figure 7A:
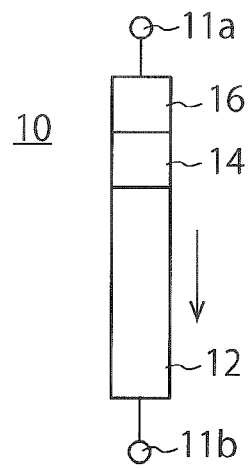
FIG. 7A is a schematic diagram showing a magnetic memory according to a comparative example.
Figure 7B:
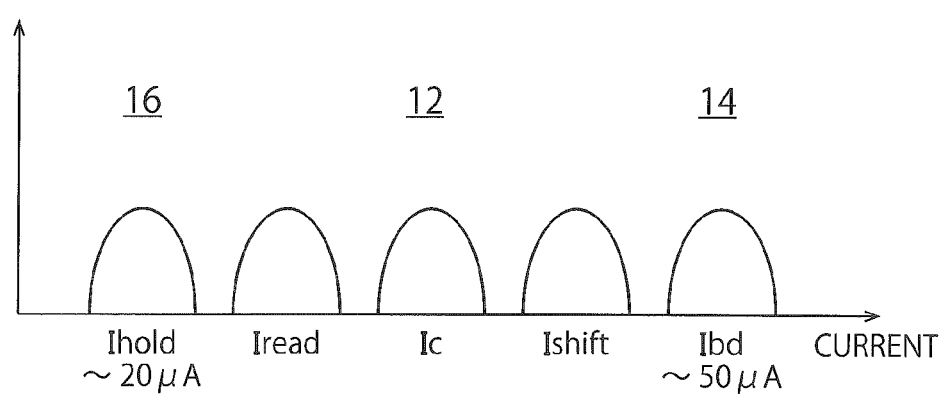
FIG. 7B is a diagram illustrating an example of a current distribution in the magnetic memory according to the comparative example.

FIG. 7A is a schematic diagram showing the configuration of a magnetic memory according to a comparative example, and FIG. 7B shows a current distribution of the magnetic memory according to the comparative example. As shown in FIG. 7A, the magnetic memory according to the comparative example has a memory cell 10 including, between two terminals 11a and 11b, a magnetic member 12, an MTJ element 14, and a switching element 16. The MTJ element 14 is disposed between the magnetic member 12 and the switching element 16. The terminal 11a is electrically connected to the switching element 16, and the terminal 11b is electrically connected to the magnetic member 12.

In the magnetic memory according to the comparative example, the read operation and the shift operation for shifting the domain walls are performed by causing a read current Iread or a shift current Ishift between the terminal 11a and the terminal 11b.

The magnetic memory including the above-described configuration has the current distribution shown in FIG. 7B. A holding current Ihold, which flows through the switching element 16 to maintain the ON state of the switching element 16, is smaller than the read current Iread of the magnetic memory. A threshold current Ic for shifting the domain walls of the magnetic member 12 is greater than the read current Iread. The shift current Ishift for shifting the domain walls is greater than the threshold current Ic and smaller than a breakdown current Ibd with which the tunnel barrier of the MTJ element 14 is broken. Thus, in the magnetic memory according to the comparative example, a current distribution needs to be set in such a manner that the read current Iread and the shift current Ishift are between the holding current Ihold of the switching element 16 and the breakdown current Ibd of the MTJ element.

Figure 8A:
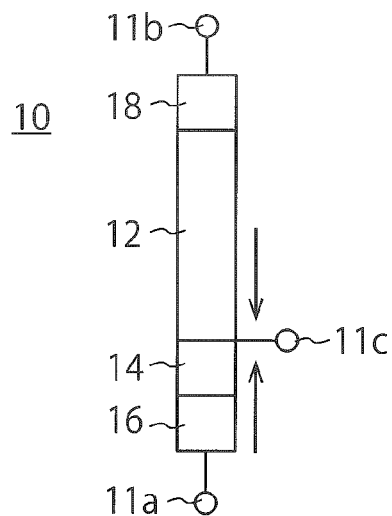
FIG. 8A is a schematic diagram of the magnetic memory according to the first embodiment.

In contrast, the magnetic memory according to this embodiment has three terminals as shown in FIG. 8A. Specifically, the magnetic memory according to this embodiment includes the memory cell 10, in which the switching element 16, the MTJ element 14, the magnetic member 12, and the switching element 18 are disposed between the terminal 11a and the terminal 11b, and the terminal 11c is provided between the MTJ element 14 and the magnetic member 12. In the magnetic memory shown in FIG. 8A, the read operation is performed by causing the read current Iread to flow between the terminal 11a and the terminal $11c$, and the shift operation is performed by causing the shift current Ishift between the terminal $11b$ and the terminal $11c$.

Figure 8B:
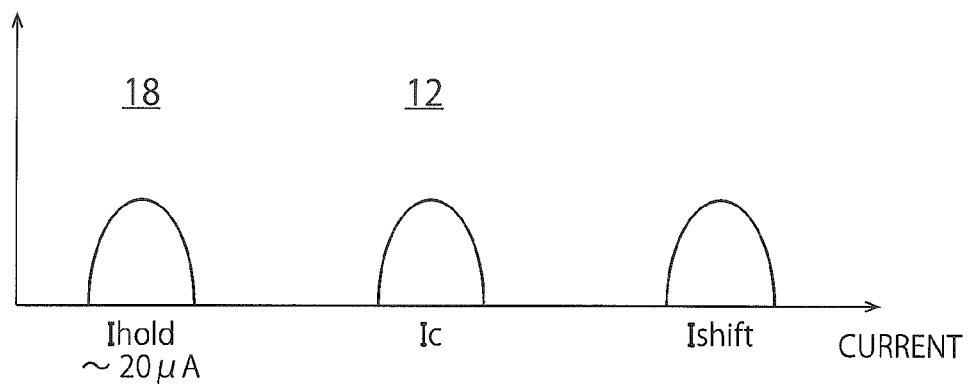
FIG. 8B is a diagram illustrating a current distribution during the shift operation of the magnetic memory according to the first embodiment.
Figure 8C:
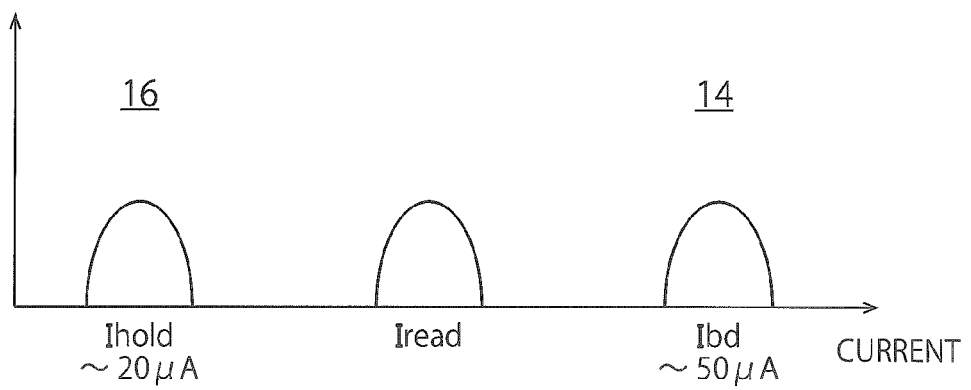
FIG. 8C is a diagram illustrating a current distribution during the read operation of the magnetic memory according to the first embodiment.

Since the shift current path and the read current path are separated from each other in the magnetic memory shown in FIG. 8A, the shift current Ishift may have a current distribution shown in FIG. 8B, and the read current Iread may have a current distribution shown in FIG. 8C. Specifically, the shift current Ishift is greater than the holding current Ihold of the switching element 18 and the threshold current Ic for shifting the domain walls, and the read current Iread is greater than the holding current Ihold of the switching element 16 and smaller than the breakdown current Ibd of the MTJ element 14. Thus, the operational margin of the magnetic memory according to this embodiment is broader than that of the magnetic memory according to the comparative example. As described above, in the magnetic memory according to this embodiment, the operational margin may be broadened since the shift current path and the read current path are separated from each other. Furthermore, erroneous shifting (read disturb) caused by the read current may be prevented. Since the shift current does not flow through the MTJ elements, the change in magnetoresistance (MR) of the MTJ element does not affect the pulse shape of the shift current. Furthermore, since the shift current does not flow through the MTJ element, no voltage stress is applied to the MTJ element, improving the durability of the MTJ element. Since the MTJ element and the magnetic member are not directly connected to each other, the effective MR of the MTJ element may be increased. Since the operational margin may be broadened, the read current may be increased, thereby facilitating the maintaining of the ON state of the switching element.

Second Embodiment

A second embodiment will now be described. The second embodiment is a method of manufacturing the magnetic memory according to the first embodiment. FIGS. 9 to 17 show the respective steps of the method.

Figure 9:
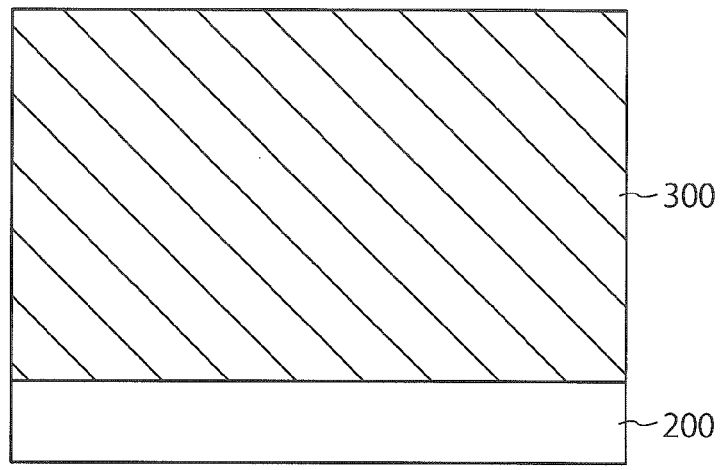
FIGS. 9 to 17 are cross-sectional views illustrating a process of manufacturing a magnetic memory according to a second embodiment.
Figure 10:
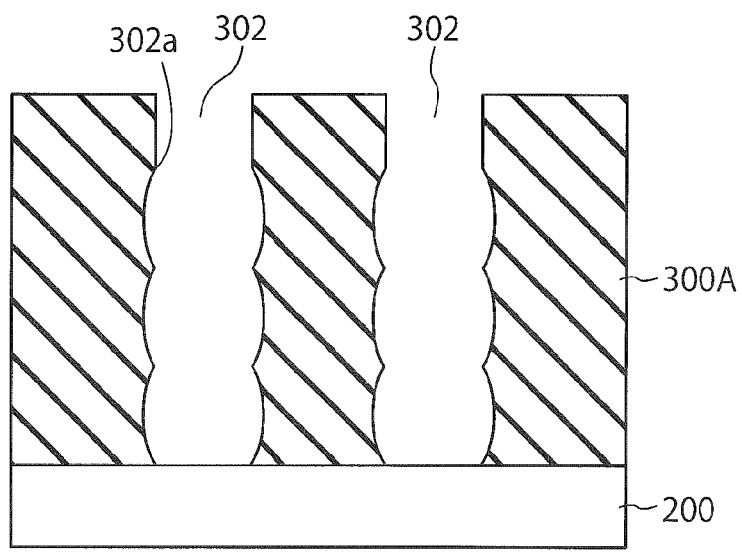

First, a metal layer 300 of an aluminum oxide is formed on a silicon substrate 200, or a substrate 300 of aluminum is bonded to the silicon substrate 200 (FIG. 9). Subsequently, anode oxidation is performed on the metal layer 300. During the anode oxidation, the metal layer 300 or the silicon substrate 200 is set as an anode, and a current is caused to flow in an electrolytic solution (for example, any of or any combination of sulfuric acid, oxalic acid, and phosphoric acid). The metal layer (aluminum) is then oxidized, forming metal ions and dissolving. The metal ions are combined with oxygen in the electrolytic solution to make a metal oxide (aluminum oxide), which grows on the surface of the metal layer 300. As the dissolving and the growth advance at the same time, minute holes 302 surrounded by the aluminum oxide are formed on the surface of the aluminum of the metal layer 300. While the holes 302 are formed, a second voltage is periodically added, the second voltage being different from the first voltage applied to form the holes. While the second voltage is applied, portions $302a$ having smaller dimensions (diameter) in the x direction and the y direction shown in FIG. 2 are formed. The aluminum in the regions around the hoes 302 is changed to aluminum oxide 300A (FIG. 10).

Figure 11:
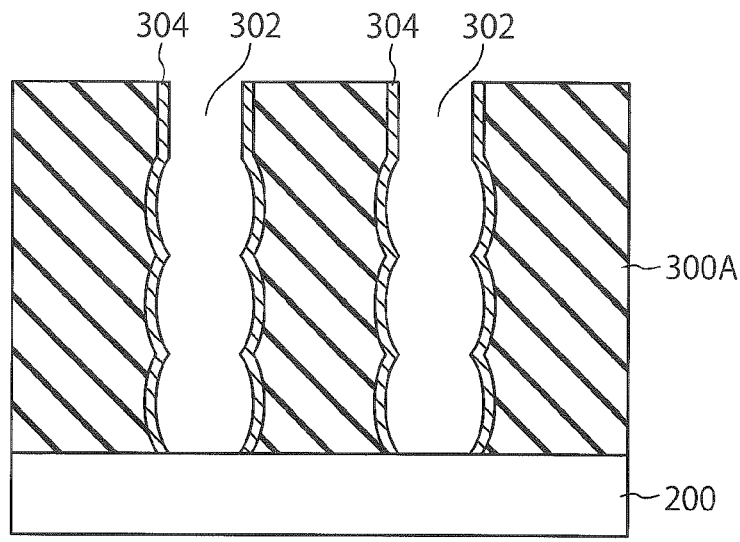
Figure 12:
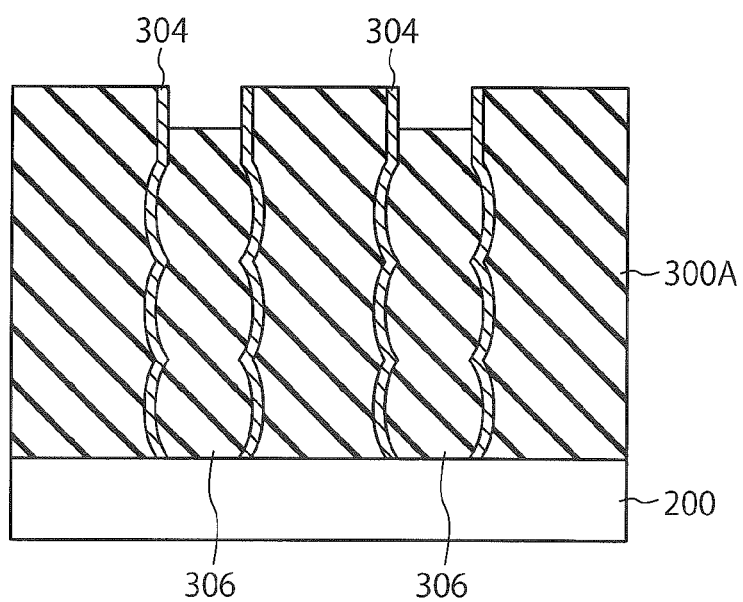

Subsequently, as shown in FIG. 11, a magnetic layer 304 covering the inner surface of each hole 302 is formed. The magnetic layer 304 corresponds to the magnetic members $12_{11}$ and $12_{12}$ shown in FIG. 2. Thereafter, a non-magnetic insulating film (for example, a silicon oxide film) 306 is formed to fill into each hole 302, except for the upper portion of the hole 302, as shown in FIG. 12.

Figure 13:
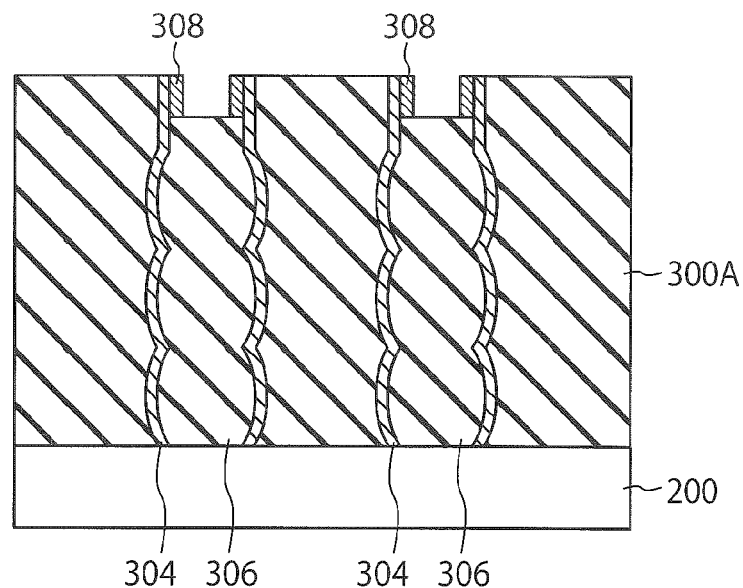
Figure 14:
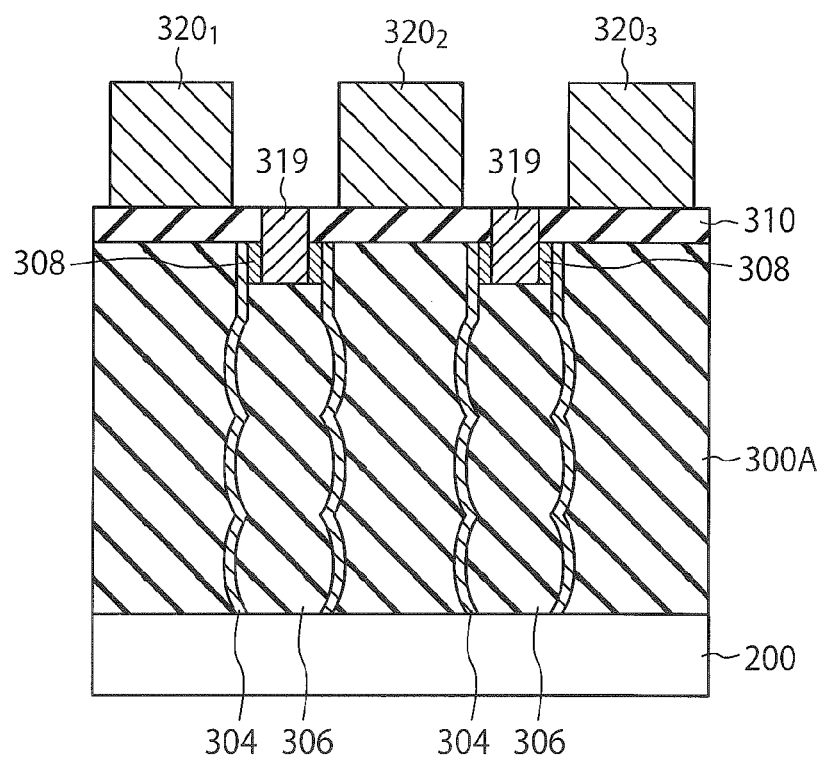

A non-magnetic conductor layer 308 covering the side surface of the upper portion of each hole 302 is then formed, as shown in FIG. 13. The conductor layer 308 corresponds to the conductor layers $17_{11}$ and $17_{12}$ shown in FIG. 2. Thereafter, a non-magnetic insulating film (for example, a silicon oxide film) 310 is formed to fill the hole 302 and to cover the top surface of the aluminum oxide 300A. Openings are then formed in the insulating film 310 using the photolithographic technique. The top surface of the insulating film 306 and the inner side surface of the conductor layer 308 are exposed in each opening. A magnetic member (for example, a soft magnetic member) 319 is then filled into each opening. The magnetic member 319 corresponds to a part of the magnetic members $19_{11}$ and $19_{12}$ shown in FIG. 2. Wirings $320_1$, $320_2$, and $302_3$ are then formed on the insulating film 310. The wirings $320_1$, $320_2$, and $302_3$ correspond to the field lines $20_1$, $20_2$, and $20_3$ shown in FIG. 2, respectively (FIG. 14).

Figure 15:
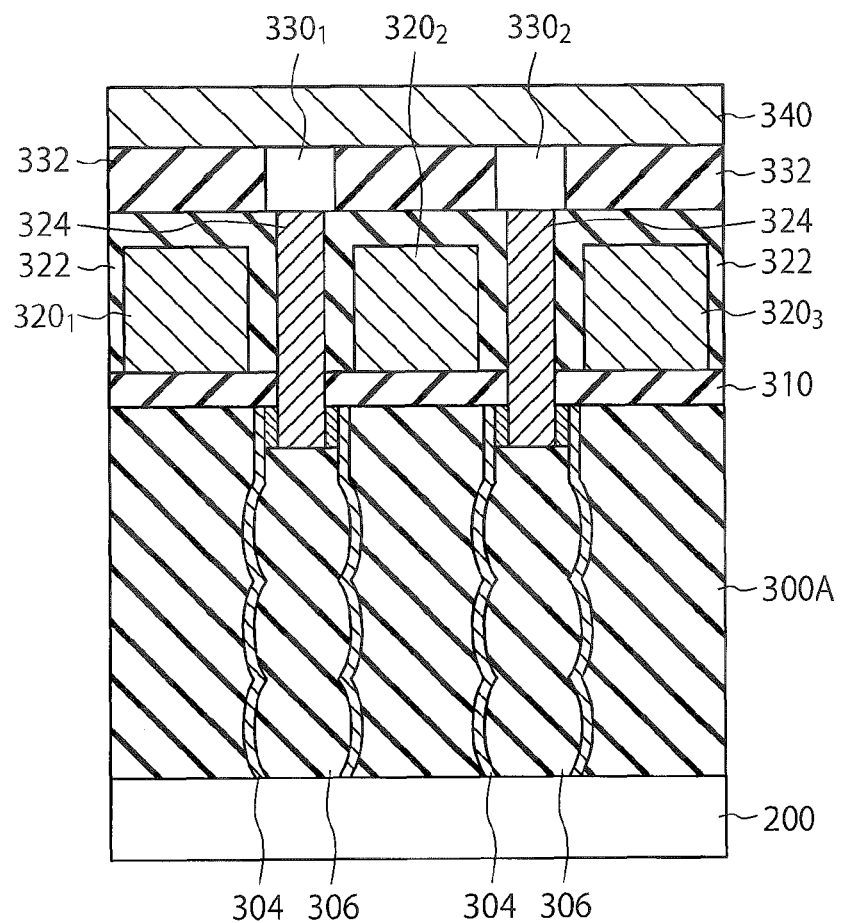

A non-magnetic insulating film (for example, a silicon oxide film) 322 covering the wirings $320_1$, $320_2$, and $302_3$ is then formed (FIG. 15). Openings are formed through the insulating film 322 by using the photolithographic technique to expose the top surface of the magnetic member 319. A magnetic member (for examples, a soft magnetic member) 324 is filled into each opening. The magnetic members 324 correspond to the rest of the magnetic members $19_{11}$ and $19_{12}$ shown in FIG. 2. A non-magnetic insulating film (for example, a silicon oxide film) 332 covering the magnetic members 324 is then formed on the insulating film 322. Openings are formed through the insulating film 332 using the photolithographic technique to expose the top surface of the magnetic member 324. Switching elements $330_1$ and $330_2$ are formed to fill the openings. The switching elements $330_1$ and $330_2$ correspond to the switching elements $18_{11}$ and $18_{12}$ shown in FIG. 2. A wiring 340 electrically connected to the switching elements $330_1$ and $330_2$ are formed on the insulating film 332 (FIG. 15). The wiring 340 corresponds to the bit line $BL_1$ shown in FIG. 2. Subsequently, a non-magnetic insulating film (for example, a silicon oxide film), which is not shown, is formed to cover the wiring 340. The non-magnetic insulating film is smoothed by chemical mechanical polishing (CMP) to expose the surface of the wiring 340.

A CMOS circuit including the control circuits 101, 102, and 103 shown in FIG. 1 is formed on another substrate 400.

Figure 16:
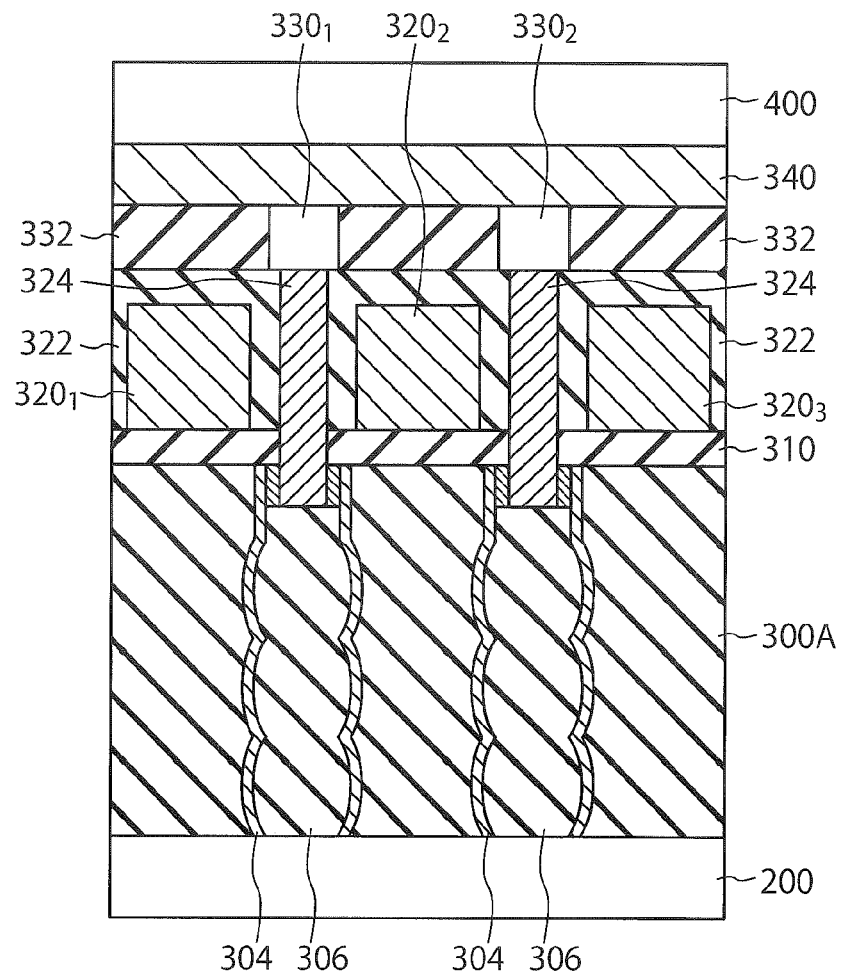

The substrate 400 with the CMOS circuit is reversed and joined to the substrate on which the magnetic layer 304, the magnetic member 324, the switching elements $330_1$ and $330_2$, and the wiring 340 are formed as shown in FIG. 16. The substrates are joined so that the surface of the substrate 400 on which the CMOS circuit is formed faces the wiring 340. The wirings 340, $320_1$, $320_2$, and $320_3$ shown in FIG. 16 are electrically connected to the CMOS circuit.

The silicon substrate 200 is then polished from the back side by CMP for example, until the surface of the aluminum oxide 300A is exposed. The end portion of the magnetic layer 304 is also exposed at this time. Subsequently, wirings $500_1$ and $500_2$ each electrically connected to the magnetic layer 304 are formed on the exposed surface of the aluminum oxide. The wirings $500_1$ and $500_2$ correspond to the source lines $SL_1$ and $SL_2$ shown in FIG. 2. Thereafter, a non-magnetic insulating film (for example, a silicon oxide film) 502 is formed to cover the wirings $500_1$ and $500_2$. The insulating film 502 is smoothed by using CMP for example to expose the surfaces of the wirings $500_1$ and $500_2$. MTJ elements $516_1$ and $516_2$ that are electrically connected to the exposed surfaces of the wirings $500_1$ and $500_2$ respectively are then formed. The MTJ element $516_i$ (i=1, 2) includes a fixed layer 514 in which the magnetization direction is fixed, a free layer 510, which is disposed between the fixed layer 514 and the wiring $500_i$, and in which the magnetization direction may be changed, and a non-magnetic insulating layer (tunnel barrier layer) 512 disposed between the fixed layer 514 and the free layer 510.

Figure 17:
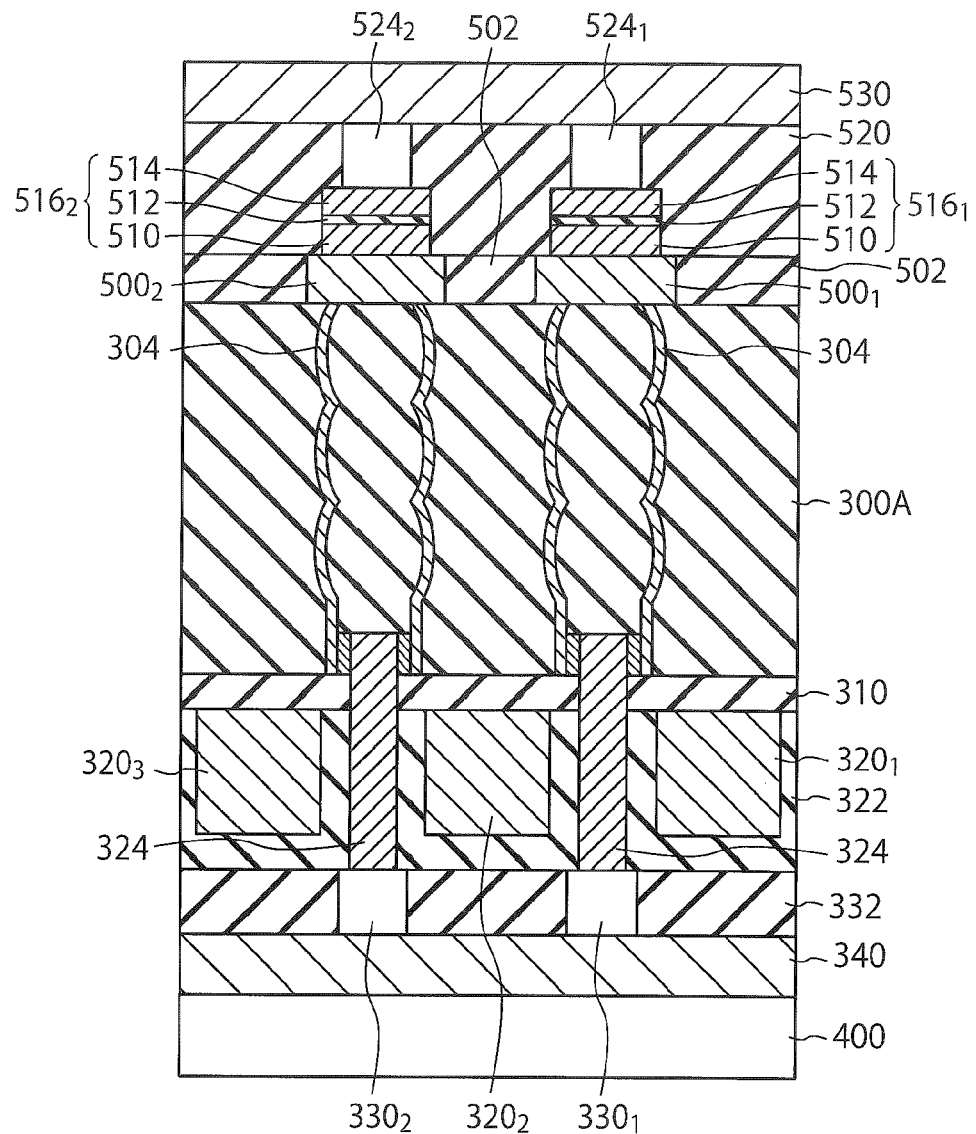

Subsequently, a non-magnetic insulating film (for example, a silicon oxide film) 520 is formed to cover the MTJ elements $516_1$ and $516_2$, as shown in FIG. 17. Openings are then formed through the insulating film 520 by using the lithographic technique until the top surface of the fixed layer 514 included in each of the MTJ elements $516_1$ and $516_2$ is exposed, and switching elements $524_1$ and $524_2$ that are each electrically connected to the fixed layer 514 are formed. The switching elements $524_1$ and $524_2$ correspond to the switching element $16_{11}$, $16_{12}$ shown in FIG. 2. Thereafter, a wiring 530 electrically connected to the switching elements $524_1$ and $524_2$ is formed. The wiring 530 corresponds to the data line $DL_1$ shown in FIG. 2. A non-magnetic insulating film (for example, a silicon oxide film) that is not shown is formed to cover the wiring 530, and smoothed by CMP. The MTJ elements $516_1$ and $516_2$ and the wirings 530, $500_1$, and $500_2$ are electrically connected to the CMOS circuit formed on the substrate 400 through vias embedded in minute holes (for examples the holes 302 shown in FIG. 10) formed in the aluminum oxide 300A.

The magnetic layer 304 shown in FIG. 11 is not formed in the holes in which the vias are embedded. However, a dummy magnetic layer may be embedded in such holes.

The magnetic memory according to the first embodiment is manufactured in the above-described manner.

In the magnetic memory manufactured according to the second embodiment, the path of the shift current for moving the domain walls in a memory cell is different from a current path for reading data from the memory cell, as is explained in the descriptions of the first embodiment. As a result, the erroneous shifting of the domain walls caused by the read current, the read disturb, can be avoided. This enables the broadening of the operational margin caused by variations of current distribution.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first wiring;
a second wiring;
a first switching element disposed between the first wiring and the second wiring;
a first magnetic member extending in a first direction and disposed between the first switching element and the second wiring;
a third wiring disposed between the first magnetic member and the second wiring;
a first magnetoresistive element disposed between the third wiring and the second wiring; and
a second switching element disposed between the first magnetoresistive element and the second wiring.

2. The magnetic memory according to claim 1, wherein:
the first switching element includes a first terminal and a second terminal, the first terminal being electrically connected to the first wiring;
the first magnetic member includes a first end portion and a second end portion, the first end portion being electrically connected to the second terminal, and the second end portion being electrically connected to the third wiring;
the first magnetoresistive element includes a third terminal and a fourth terminal, the third terminal being electrically connected to the third wiring; and
the second switching element includes a fifth terminal and a six terminal, the fifth terminal being electrically connected to the fourth terminal, and the six terminal being electrically connected to the second wiring.

3. The magnetic memory according to claim 2, wherein the second end portion is electrically connected to one of two opposing surfaces of the third wiring, and the third terminal is electrically connected to another of the two opposing surfaces of the third wiring.

4. The magnetic memory according to claim 2, wherein the first magnetoresistive element includes a first magnetic layer electrically connected to the third wiring, a second magnetic layer electrically connected to the fifth terminal, and a non-magnetic layer disposed between the first magnetic layer and the second magnetic layer.

5. The magnetic memory according to claim 1, wherein:
the first magnetic member includes a first end portion and a second end portion, the first end portion being electrically connected to the first wiring via the first switching element, and the second end portion being electrically connected to one of two opposing surfaces of the third wiring; and
the first magnetoresistive element includes one terminal that is electrically connected to another of the two opposing surfaces of the third wiring, and another terminal that is electrically connected to the second wiring via the second switching element.

6. The magnetic memory according to claim 1, wherein the first wiring and the second wiring extend in a second direction crossing the first direction, and the third wiring extends in a third direction crossing the first and second directions.

7. The magnetic memory according to claim 1, wherein the first magnetic member has a cylindrical shape.

8. The magnetic memory according to claim 7, wherein a peripheral shape of a cross section of the first magnetic member taken along a plane perpendicular to the first direction is circular, oval, or polygonal.

9. The magnetic memory according to claim 7, further comprising:
a second magnetic member including a third end portion and a fourth end portion, the third end portion being electrically connected to the first wiring via the first switching element, and the fourth end portion being electrically connected to an inner surface of the first magnetic member; and
a fourth wiring disposed to extend in a direction crossing the first direction so as to be separated from the second magnetic member.

10. The magnetic memory according to claim 1, further comprising a control circuit configured to supply a current for shifting a domain wall of the first magnetic member between the first wiring and the third wiring, and supply a read current between the second wiring and the third wiring.

11. A magnetic memory comprising:
a first wiring;
a second wiring;
a first switching element disposed between the first wiring and the second wiring;
a first magnetic member disposed between the first switching element and the second wiring;
a third wiring disposed between the first magnetic member and the second wiring;
a first magnetoresistive element disposed between the third wiring and the second wiring;
a second switching element disposed between the first magnetoresistive element and the second wiring; and
a control circuit electrically connected to the first wiring, the second wiring, and the third wiring, the control circuit applying a first voltage to the first wiring, a second voltage that is different from the first voltage to the third wiring, and a third voltage between the first voltage and the second voltage to the second wiring to shift a domain wall of the first magnetic member, and applying a fourth voltage to the second wiring, a fifth voltage that is different from the fourth voltage to the third wiring, and a sixth voltage between the fourth voltage and the fifth voltage to the first wiring to read data from the first magnetoresistive element.

12. The magnetic memory according to claim 11, further comprising:
a fourth wiring that is adjacent to the first wiring in a first direction;
a fifth wiring that is adjacent to the second wiring in the first direction;
a third switching element disposed between the fourth wiring and the fifth wiring;
a second magnetic member disposed between the third switching element and the fifth wiring;
a second magnetoresistive element disposed between the second magnetic member and the fifth wiring; and
a fourth switching element disposed between the second magnetoresistive element and the fifth wiring,
wherein:
the third wiring is disposed between the second magnetic member and the second magnetoresistive element; and
the control circuit applies the third voltage to the fourth wiring and to the fifth wiring to shift the domain wall of the first magnetic member, and the sixth voltage to the fourth wiring and to the fifth wiring to read the data from the first magnetoresistive element.

13. The magnetic memory according to claim 12, wherein:
the first switching element includes a first terminal and a second terminal, the first terminal being electrically connected to the first wiring;
the first magnetic member includes a first end portion and a second end portion, the first end portion being electrically connected to the second terminal, and the second end portion being electrically connected to the third wiring;
the first magnetoresistive element includes a third terminal and a fourth terminal, the third terminal being electrically connected to the third wiring;
the second switching element includes a fifth terminal and a six terminal, the fifth terminal being electrically connected to the fourth terminal, and the six terminal being electrically connected to the second wiring;
the third switching element includes a seventh terminal and an eighth terminal, the seventh terminal being electrically connected to the fourth wiring;
the second magnetic member includes a third end portion and a fourth end portion, the third end portion being electrically connected to the eighth terminal, and the fourth end portion being electrically connected to the third wiring;
the second magnetoresistive element includes a ninth terminal and a tenth terminal, the ninth terminal being electrically connected to the third wiring; and
the fourth switching element includes an eleventh terminal and a twelfth terminal, the eleventh terminal being electrically connected to the tenth terminal, and the twelfth terminal being electrically connected to the fifth wiring.

14. The magnetic memory according to claim 13, wherein the first magnetic member and the second magnetic member extend in a second direction crossing the first direction.

15. The magnetic memory according to claim 14, wherein each of the first magnetic member and the second magnetic member has a cylindrical shape.

16. The magnetic memory according to claim 15, wherein each of the first magnetic member and the second magnetic member has a cross section taken along a plane perpendicular to the second direction, a peripheral shape of the cross section being circular, oval, or polygonal.

17. The magnetic memory according to claim 15, further comprising:
a third magnetic member including a fifth end portion and a sixth end portion, the fifth end portion being electrically connected to the second terminal, and the sixth end portion being electrically connected to an inner surface of the first end portion;
a sixth wiring disposed to be separated from the third magnetic member in a direction crossing the second direction;
a fourth magnetic member including a seventh end portion and an eighth end portion, the seventh end portion being electrically connected to the eighth terminal, and the eighth end portion being electrically connected to an inner surface of the third end portion; and
a seventh wiring disposed to be separated from the fourth magnetic member in the direction crossing the second direction.

18. The magnetic memory according to claim 14, wherein the first wiring, the second wiring, the fourth wiring, and the fifth wiring extend in a third direction crossing the first and second directions, and the third wiring extends in a direction crossing the second and third directions.

19. A magnetic memory comprising:
a first wiring;
a second wiring;
a third wiring;
a first switching element including a first terminal and a second terminal, the first terminal being electrically connected to the first wiring;
a first magnetic member extending in a first direction and including a first end portion and a second end portion, the first end portion being electrically connected to the second terminal, and the second end portion being electrically connected to one of two opposing surfaces of the third wiring;
a first magnetoresistive element including a third terminal and a fourth terminal, the third terminal being electrically connected to another of the two opposing surfaces of the third wiring; and a second switching element including a fifth terminal and a six terminal, the fifth terminal being electrically connected to the fourth terminal, and the six terminal being electrically connected to the second wiring.

20. The magnetic memory according to claim 19, wherein the first and second wirings extend in a second direction crossing the first direction, and the third wiring extends in a third direction crossing the first and second directions.

21. The magnetic memory according to claim 19, wherein the first magnetic member includes a domain wall to be shifted along the first direction.

\* \* \* \* \*